United States Patent
Grätz et al.

(10) Patent No.: US 6,191,985 B1
(45) Date of Patent: Feb. 20, 2001

(54) DYNAMIC MEMORY HAVING TWO MODES OF OPERATION

(75) Inventors: Thoralf Grätz, Dresden; Patrick Heyne, München; Dieter Härle, München; Helmut Schneider, München, all of (DE)

(73) Assignee: Infineon Technologies AG, Munich (DE)

( * ) Notice: Under 35 U.S.C. 154(b), the term of this patent shall be extended for 0 days.

(21) Appl. No.: 09/528,424

(22) Filed: Mar. 17, 2000

Related U.S. Application Data

(63) Continuation of application No. PCT/DE98/02250, filed on Aug. 5, 1998.

(30) Foreign Application Priority Data

Sep. 17, 1997 (DE) .............................................. 197 40 933

(51) Int. Cl.[7] ...................................................... G11C 7/00
(52) U.S. Cl. ........................ 365/200; 365/201; 365/222; 365/230.03
(58) Field of Search ................................. 365/200, 201, 365/222, 230.03

(56) References Cited

U.S. PATENT DOCUMENTS

| | | |
|---|---|---|
| 5,233,566 | 8/1993 | Imamiya . |
| 5,381,371 | 1/1995 | Haraguchi . |
| 5,530,674 | 6/1996 | McClure . |
| 5,691,949 * | 11/1997 | Hively et al. ...................... 365/222 X |
| 5,991,218 * | 11/1999 | Kushiyama ....................... 365/200 X |

FOREIGN PATENT DOCUMENTS

| | | |
|---|---|---|
| 42 41 327 A1 | 6/1993 | (DE) . |
| 0 529 330 A2 | 3/1993 | (EP) . |
| 0 884 735 A2 | 12/1998 | (EP) . |

OTHER PUBLICATIONS

"A 45–ns 64–Mb DRAM with a Merged Match–Line Test Architecture" (Mori et al.), dated Nov. 1991, 8107 IEEE Journal of Solid–State Circuits, No. 11, New York, pp. 1486–1491, as mentioned on p. 3 of the specification.

* cited by examiner

Primary Examiner—Huan Hoang
(74) Attorney, Agent, or Firm—Herbert L. Lerner; Laurence A. Greenberg; Werner H. Stemer

(57) ABSTRACT

A dynamic memory includes memory cells combined to form blocks and blocks combined to form at least one block group. The memory also includes bit lines and word lines connected to the memory cells for selecting the memory cells, redundant memory cells within the blocks, at least one redundant word line in at least one of the blocks, and a decoder unit connected to the word lines. The redundant word lines are connected to the redundant memory cells for selecting the redundant memory cells. A redundant word line, after redundancy programming has been carried out, selectively replaces a word line in any of the blocks. In a first mode of operation, no more than one of the word lines is selected simultaneously per block group. In a second mode of operation, more than one of the word lines is selected simultaneously per block group, and redundancy programming is deactivated.

7 Claims, 2 Drawing Sheets

DYNAMIC MEMORY HAVING TWO MODES OF OPERATION

CROSS-REFERENCE TO RELATED APPLICATION

This is a continuation of copending international application PCT/DE98/02250, filed Aug. 5, 1998, which designated the United States.

BACKGROUND OF THE INVENTION

FIELD OF THE INVENTION

Dynamic random access memories (DRAMs) are customarily organized in blocks. Each memory block has a number of memory cells that can be selected through word and bit lines. In the customary one-transistor memory cell, a storage capacitor is connected to one of the bit lines through a selection transistor. A control connection of the selection transistor is connected to one of the word lines. The word and bit lines are disposed in the form of a matrix. The memory cells are configured at their points of intersection. Each memory block is delimited on two opposing sides by sense amplifiers. No more than one word line can be selected simultaneously per memory block because a plurality of memory cells would otherwise be connected to the same bit line simultaneously.

To repair faulty DRAMs, different redundancy methods are known in which word lines containing faulty memory cells are replaced by redundant word lines whose memory cells are intact. If appropriate redundancy programming is carried out, when a word address is applied that addresses the faulty word line, the redundant word line is selected instead of the faulty one, and selection of the faulty word line is prevented. The redundant word lines are configured parallel to the normal word lines in each memory block, and are connected to redundant memory cells. The redundant memory cells are similarly connected to the bit lines in the memory block.

A distinction is drawn between intrablock redundancy and interblock redundancy. With intrablock redundancy, only a redundant word line from the same memory block can replace a faulty word line. With interblock redundancy, a redundant word line from another memory block can also replace a faulty word line. While intrablock redundancy ensures that no more than one word line is ever activated within a block by replacing a faulty word line in a block with a redundant word line from the same block, it is possible that with interblock redundancy, in addition to an intact word line in a block being activated, a redundant word line in the same block (replacing a faulty word line in another block at the same instant) is also activated. To benefit from the advantages of interblock redundancy—namely, replacing word lines with redundant word lines from other blocks—the sacrifice must therefore be that only a single word line per group of memory blocks to which interblock redundancy applies is activated at the same instant, instead of one word line per memory block (as in the case of intrablock redundancy).

Because the storage capacitors used in dynamic memories lose their charge as a result of leakage currents, dynamic memories have an inherent property necessitating memory cell refreshing at certain intervals of time. Regular refreshing must be carried out for each memory cell. Because in memories with interblock redundancy not more than one word line is activated per interblock group, the same holds true for refreshing the memory cells. Therefore, refreshing takes a relatively long time.

German Published, Non-Prosecuted Patent Application 42 41 327 A1 describes a dynamic memory having memory cells combined to form blocks, and having bit lines and word lines for selecting the memory cells, the blocks being combined to form a block group.

IEEE Journal of Solid State Circuits, Volume 26, No. 11, Nov. 1, 1991, pages 1486–1491, Shigeru Mori et al., describes a dynamic memory having memory cells which are combined to form blocks and having bit lines and word lines for selecting the memory cells.

SUMMARY OF THE INVENTION

It is accordingly an object of the invention to provide a dynamic memory having two modes of operation that overcomes the hereinafore-mentioned disadvantages of the heretofore-known devices of this general type and that has improved properties.

With the foregoing and other objects in view, there is provided, in accordance with the invention, a dynamic memory, including memory cells combined to form blocks and blocks combined to form block groups, bit lines and word lines connected to the memory cells for selecting the memory cells, redundant memory cells in the blocks, at least one redundant word line in at least one of the blocks, the at least one redundant word line connected to the redundant memory cells for selecting the redundant memory cells, the at least one redundant word line, after redundancy programming has been carried out, selectively replacing one of the word lines in any of the blocks, and a decoder unit connected to the word lines, in a first mode of operation, simultaneously selecting one of the word lines in each of the block groups, and in a second mode of operation, simultaneously selecting more than one of the word lines in each of the block groups and deactivating redundancy programming.

The dynamic memory according to the invention has memory cells that are combined to form blocks and are selected through bit lines and word lines. The blocks are combined to form at least one block group. The memory has a first mode of operation, in which only one of the word lines is selected simultaneously per block group, and a second mode of operation, in which more than one of the word lines are selected simultaneously per block group. A further provision of the invention is that the dynamic memory has interblock redundancy. Interblock redundancy means that at least one of its blocks has at least one redundant word line (containing redundant memory cells) that is used for selectively replacing one of the word lines in any of the blocks in the same block group after redundancy programming has been carried out. In addition, in the embodiment, redundancy programming that has already been carried out is deactivated in the second mode of operation.

Hence, in the second mode of operation, the deactivation unit is used to eliminate redundancy programming that has already been carried out, so that interblock redundancy is not active. Thus, one word line per block can be activated subsequently without any risk because no redundant word line can be active at the same time due to the deactivation of the redundancy.

In the second mode of operation, a larger number of word lines can advantageously be selected than in the first mode of operation in the same time. In the second mode of operation, one word line can be selected in each block at the same instant, for example.

The first mode of operation can, for example, be a normal mode of operation of the memory, in which the content of selected memory cells is read from the memory and new data is written into selected memory cells. The second mode of operation can, for example, be a refresh mode of operation, in which the content of at least some of the memory cells is refreshed. The memory cells are then advantageously refreshed in a shorter time than in the first mode of operation because a plurality of word lines per block group are refreshed simultaneously.

So that the redundant word lines can also be selected in the second mode of operation, one development of the invention provides for the redundant word lines to be assigned addresses that have already been precoded before redundancy programming is carried out and for the redundant word lines to be addressed using the precoded addresses or their complements in the second mode of operation (i.e., with redundancy programming deactivated). The configuration allows, by way of example, the redundant memory cells to be refreshed as well in the second mode of operation, in which redundancy programming is deactivated.

In one development of the invention, the dynamic memory has a test mode of operation for continuously testing the memory cells (burn-in test). During the test mode, the memory is switched to the second mode of operation. Thus, in the test mode, a larger number of word lines is selected than in the first mode of operation, so that the memory cells can advantageously be tested in a relatively short time. Particularly, if the second mode of operation is a refresh mode of operation, the burn-in test can be carried out in a relatively short time because no data is supplied to outside the memory during refreshing. Rather, refreshing is always carried out within a memory block. The development ensures that the memory cells are continuously loaded even without reading data from the memory.

According to one advantageous development of the invention, the memory has a deactivation unit for deactivating redundancy programming that has already been carried out for corresponding memory elements in the second mode of operation.

In accordance with another feature of the invention, there is provided a redundancy decoder connected at least to one of the decoder unit and the at least one redundant word line, the redundancy decoder having memory elements and a deactivation unit connected to the memory elements, the deactivation unit deactivating, in the second mode of operation, redundancy programming that has been carried out for corresponding ones of the memory elements.

In accordance with a further feature of the invention, there are provided jumper elements, each of the memory elements including a breakable connection for storing addresses for one of the word lines that is to be replaced by the at least one redundant word line, the connection broken as appropriate during redundancy programming, and the jumper elements bridging the connection in order to deactivate redundancy programming in the second mode of operation.

In accordance with an added feature of the invention, the memory elements of the redundancy decoder have hold circuits for accepting information stored in the memory elements when a setting signal is activated, and the deactivation unit suppresses activation of the setting signal during the second mode of operation.

In accordance with an additional feature of the invention, the at least one redundant word line is assigned an address precoded before redundancy programming, and the at least one redundant word line is addressed using at least one of the address or a complement of the address in the second mode of operation.

In accordance with yet another feature of the invention, there is provided a test mode of operation for continuously testing the memory cells and switching the dynamic memory to the second mode of operation during the test mode.

In accordance with a concomitant feature of the invention, the second mode of operation is a refresh mode of operation, the memory cells have contents, and the contents of at least some of the memory cells are refreshed during the refresh mode.

Other features that are considered as characteristic for the invention are set forth in the appended claims.

Although the invention is illustrated and described herein as embodied in a dynamic memory having two modes of operation, it is nevertheless not intended to be limited to the details shown, because various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 2A is a circuit diagram for implementing the memory of FIG. 1;

FIG. 2B is a signal profile diagram for the embodiment of FIG. 2A; and

FIG. 3 is an alternative circuit diagram for implementing the memory of FIG. 1.

DESCRIPTION OF THE PREFERRED EMBODIMENTS

Figure 1:
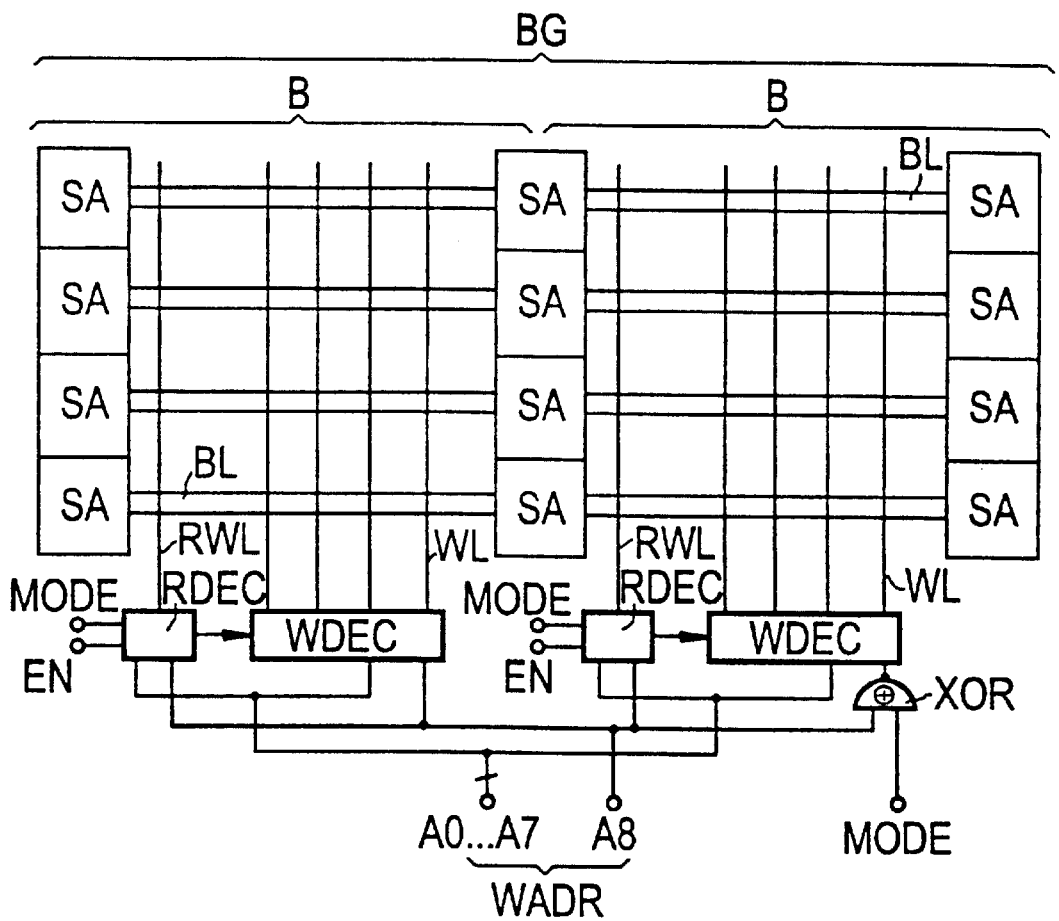
FIG. 1 is a diagrammatic representation of an embodiment of the dynamic memory according to the invention.

In all the figures of the drawing, sub-features and integral parts that correspond to one another bear the same reference symbol in each case.

Referring now to the figures of the drawings in detail and first, particularly to FIG. 1 thereof, there is shown a dynamic memory having word lines WL and bit lines BL that are configured in a matrix and are combined to form two blocks B. The two blocks B form a block group BG (actual memories, of course, have a much higher number of word lines, bit lines, blocks and block groups). There are non-illustrated memory cells for the dynamic memory at each of the intersection points of the word lines WL and bit lines BL, each of the memory cells have a storage capacitor that is connected to the respective bit line BL through a selection transistor, and the gate of the transistor connected to the corresponding word line WL. Each of the blocks B is allocated a word line decoder WDEC that is used to select the word lines WL based upon word addresses WADR containing address bits A0 to A8.

The memory also has sense amplifiers SA that are connected to the bit lines BL and are configured on both sides of each of the memory blocks B. The architecture corresponds to the folded bit line concept. The sense amplifiers SA amplify information passed from one of the memory cells to the relevant bit line BL and can forward the information to external data lines of the memory. In the illustrative embodiment, however, only the part of the memory shown is of interest because the relevant topic is a refresh mode of operation of the memory. A refresh operation, i.e., refreshing the memory cell contents, takes place as follows: the memory cell to be refreshed is selected through the appropriate word line WL and its content is passed to the appropriate bit line BL. The content is amplified at the bit line BL by the sense amplifier before the selection transistor in the memory cell turns off again, resulting in the amplified information being written back into the memory cell. The sense amplifier SA is isolated from the external data lines so that the memory cell contents are not read from the memory.

The memory in FIG. 1 also has redundancy decoders RDEC, which are used to address redundant word lines RWL in the blocks B. The redundancy decoders RDEC are also fed the word addresses WADR. If one of the word lines WL is to be replaced by one of the redundant word lines RWL, memory elements within the redundancy decoders RDEC are programmed such that when the word address WADR for the word line WL to be replaced is applied, the redundancy decoder RDEC activates the redundant word line RWL instead of the word line WL and deactivates all the word line decoders WDEC in the block group BG (indicated in FIG. 1 by an arrow between each redundancy decoder RDEC and the respective word line decoder WDEC). The configuration of the redundancy decoder RDEC and of its memory elements is described further below with reference to FIGS. 2 and 3.

The dynamic memory in the illustrative embodiment is provided with interblock redundancy, which means that each of the redundant word lines RWL can replace not only a word line WL in its own block B, but also a word line WL in another block B in the same block group BG. As outlined in the introduction to the description, with interblock redundancy only one word line per block group can be activated at any instant because there is a risk that one of the word lines WL and at least one of the redundant word lines RWL will become active simultaneously within the same block B—a condition that inevitably renders useless the information read out from a plurality of memory cells to the same bit line BL. Therefore, in the memory according to the invention, a restriction is applied to have, in a first mode of operation of the memory in which interblock redundancy is active, only one word line WL per block group BG activated at a time. The word line decoders WDEC are configured such that, when a word address WADR is applied in the first mode of operation, only one of the word lines WL in the block group BG is activated.

The memory also has a second mode of operation, in which the redundant part of the memory is completely deactivated, so that a respective word line WL can now be activated per block B at the same instant without any risk. The second mode of operation is a refresh mode of operation, in which data read out is merely amplified by the appropriate sense amplifier SA and written back into the selected memory cell. In order to use the word addresses WADR to address only the word lines WL and none of the redundant word lines RWL during the second mode of operation of the memory, the redundancy decoders RDEC in FIG. 1 are fed an activation signal EN that activates the redundancy decoders RDEC in the first mode of operation and deactivates them (at least intermittently) in the second mode of operation. With the redundancy decoders RDEC deactivated, they do not address the word lines WL.

In FIG. 1, seven address bits A0 to A7 of the word address WADR are fed to both word decoders WDEC, while an eighth address bit A8 is fed to the left-hand word decoder WDEC directly and to the right-hand word decoder WDEC through an exclusive-OR gate XOR. The XOR gate has a further input that is fed an operating mode signal MODE. The operating mode signal MODE determines whether the memory is in the first or the second mode of operation. The operating mode signal MODE is at a high level in the first mode of operation and at a low level in the second mode of operation. Depending on the operating mode signal MODE, the eighth address bit A8 is fed to the right-hand word decoder WDEC in inverted or in uninverted form. Having the two word line decoders WDEC be equivalent in configuration ensures that one of the word lines WL in each of the two blocks B is selected simultaneously in the second mode of operation.

In terms of the non-illustrated components connected to the sense amplifiers SA, i.e., external data lines for reading data to outside the memory, the memory according to the invention has a similar configuration as that of conventional dynamic memory.

Figures 2A, 2B, 3:
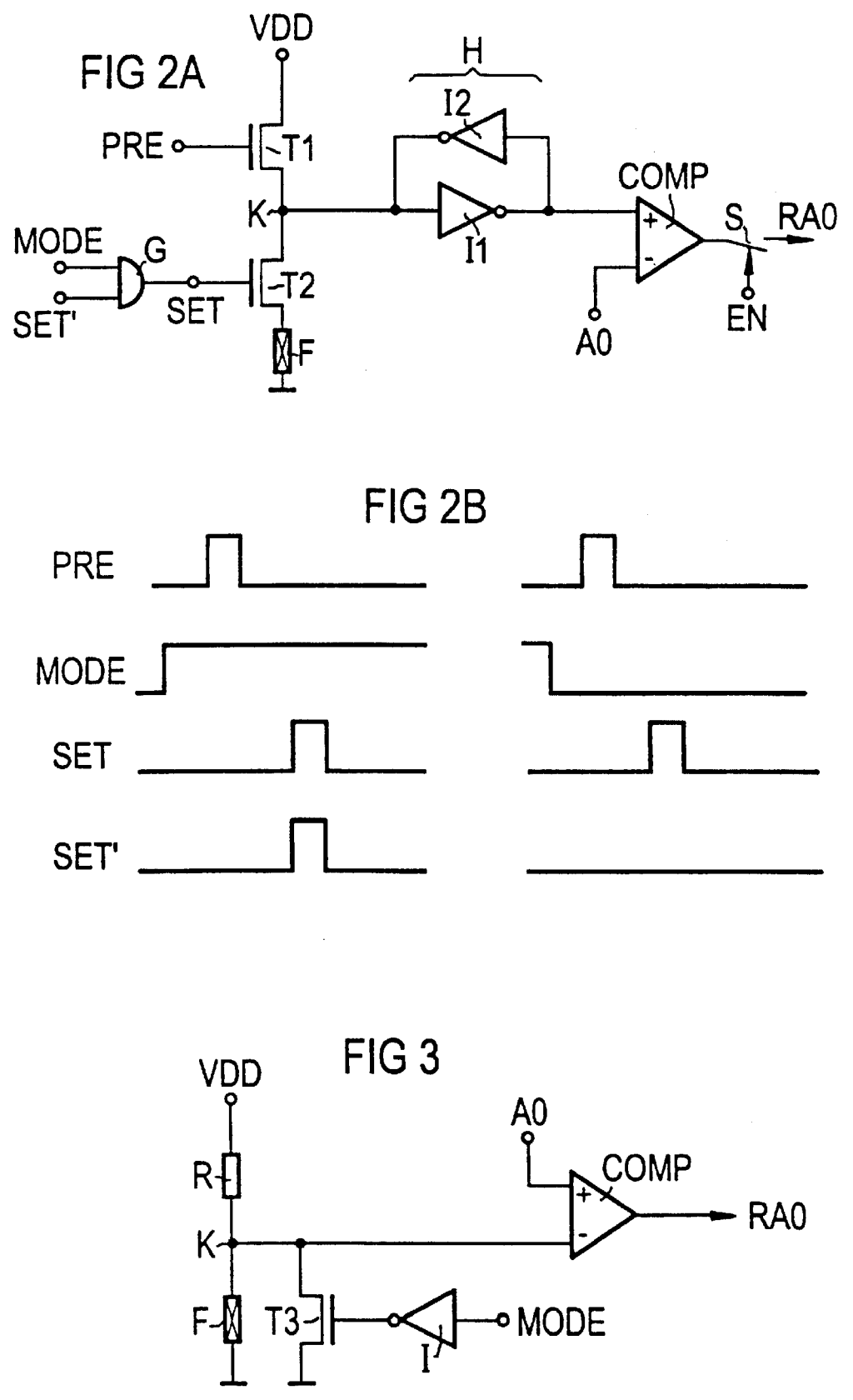

FIG. 2a shows a first illustrative embodiment of one of the redundancy decoders RDEC of FIG. 1 (the other redundancy decoder RDEC has an equivalent configuration). For each address bit A0 to A8 of the word address WADR, the redundancy decoder RDEC has a programmable memory element as shown in FIG. 2a. The programmable memory element is a breakable electrical connection F (for example, a fuse) that can be broken by laser cutting, for example. In other illustrative embodiments, equivalent circuits can also be produced using other memory elements, i.e., using antifuses. A series circuit including a first transistor T1, a second transistor T2, and the fuse F is between a supply potential VDD and a reference-ground potential for the memory. A circuit node K between the first transistor T1 and the second transistor T2 is connected to a first input of a comparator COMP through a hold circuit H. One of the address bits A0 of the word address WADR is fed to a second input of the comparator COMP. An output signal RA0 from the comparator COMP is used as one bit of an address for addressing the appropriate redundant word line RWL, provided that the address programmed using the fuses F matches the word address WADR. There is a respective equivalent memory element with a comparator for the other bits A0 to A7 of the word address WADR.

When the second transistor T2 is turned on, the state of the fuse F (intact or destroyed) is critical for determining the potential that is established at the input of the hold circuit H and at the first input of the comparator COMP. Whether the second transistor T2 is turned on or off depends, in the first mode of operation, on a setting signal SET at its gate. When the memory is started up, the second transistor T2 is initially turned off, so that the potential at the node K is independent of the state of the fuse F. When the supply potential VDD has stabilized, the node K is preloaded by a positive setting pulse of a preloading signal PRE at the gate of the first transistor T1. In the first mode of operation, a presignal SET' is used to bring the setting signal SET to the level of the supply potential VDD, so that the transistor T1 is on. This makes the redundancy programming active, and the state of the fuse F determines the potential at the first input of the comparator COMP.

To switch the memory from the first mode of operation to the second mode of operation, the memory has a deactivation unit G in the form of an AND gate, which, in addition to the presignal SET', is also fed the operating mode signal MODE. In the first mode of operation, the operating mode signal MODE is high—as already mentioned with reference to FIG. 1. In the second mode of operation, on the other hand, the operating mode signal MODE is at a low level so that the setting signal SET at the output of the AND gate G is at a low level, regardless of the state of the presignal SET', and the transistor T1 is off. Thus, the redundancy programming of the fuse F is deactivated in the second mode of operation. In other words, the state of the fuse F is irrelevant for the level at the first input of the comparator COMP.

FIG. 2a also shows how the activation signal EN is used to deactivate the redundancy decoders RDEC. The state of a switching element S, for example, a transistor, depends on the level of the activation signal EN. If the switching element S is on, the redundancy decoder RDEC is activated, otherwise it is deactivated.

FIG. 2b shows signal profiles associated with the circuit in FIG. 2a. The left-hand part of FIG. 2b shows the signal profiles for the first mode of operation (operating mode signal MODE is high), and the right-hand part shows the profiles for the second mode of operation (operating mode signal MODE is low).

FIG. 3 shows an alternative illustrative embodiment, with respect to FIG. 2a, of a detail of the redundancy decoders RDEC. There is a series circuit including a resistor element R and a fuse F between the supply potential VDD and the reference-ground potential. FIG. 3 also shows a transistor T3 connected in parallel with the fuse F. The operating mode signal MODE is connected to the gate of the transistor T3 through an inverter I. In the second mode of operation, in which the operating mode signal MODE is at a low level, the fuse F is shorted through the transistor T3 so that the potential at a circuit node K between the resistor element R and the fuse F is at a low level, regardless of the state of the fuse F. This deactivates the redundancy programming in the second mode of operation.

Of course, redundancy programming can be deactivated in the manner shown in FIG. 3 for the configuration shown in FIG. 2a as well, by using a transistor connected in parallel with the fuse F instead of the AND gate G, and vice versa. The circuit shown in FIG. 3 can also contain a hold circuit like the one shown in FIG. 2a.

Deactivation of the redundancy programming as shown in FIGS. 2a or 3 allows the redundant word lines RWL to be addressed using a precoded address (namely, that of the unprogrammed or deactivated fuses F). In the case of FIG. 3, the precoded addresses are used to address the redundant word lines RWL both before the fuses F are programmed and when the programming is deactivated by the operating mode signal MODE. In the case of FIG. 2a, the redundant word lines RWL are addressed, while the redundancy programming is deactivated, using addresses that are the inverse (complement) of the precoded addresses that were assigned to them before redundancy programming was carried out.

The memory cells are now refreshed as follows: the memory is switched from the first mode of operation to the second mode of operation by the operating mode signal MODE. At the same time, the redundancy decoders RDEC are deactivated by the activation signal EN. The word addresses WADR are applied, and one of the word lines WL in each block B is selected. When all the word lines WL have been refreshed (in which case faulty word lines might also have been selected because redundancy programming has been eliminated in the second mode of operation), the redundant word lines RWL are refreshed. To refresh the redundant word lines RWL, the redundancy decoders RDEC are activated again by the activation signal EN, while the programming of the fuses F still remains eliminated by the operating mode signal MODE (FIGS. 2a and 3). The redundant word lines RWL are then addressed using their precoded addresses during refreshing.

In the illustrative embodiment, not only "normal" refreshing takes place during normal operation of the memory, as outlined. Advantageously, refreshing in the second mode of operation also takes place while the memory is being subjected to a continuous test, a so-called burn-in test. By repeatedly refreshing the memory cells at very short time intervals over a relatively long period of time (e.g., several hours), the loading capacity of the memory is tested. In accordance with the invention, by selecting a plurality of the word lines WL or of the redundant word lines RWL per block group BG in the second mode of operation, in which the test is carried out, the test requires less time than in conventional memories with interblock redundancy.

We claim:

1. A dynamic memory, comprising:

memory cells combined to form blocks and blocks combined to form block groups;

bit lines and word lines connected to said memory cells for selecting said memory cells;

redundant memory cells in said blocks;

at least one redundant word line in at least one of said blocks, said at least one redundant word line connected to said redundant memory cells for selecting said redundant memory cells, said at least one redundant word line, after redundancy programming has been carried out, selectively replacing one of said word lines in any of said blocks; and a decoder unit connected to said word lines:
in a first mode of operation, simultaneously selecting one of said word lines in each of said block groups; and
in a second mode of operation, simultaneously selecting more than one of said word lines in each of said block groups and deactivating redundancy programming.

2. The dynamic memory according to claim 1, including a redundancy decoder connected at least to one of said decoder unit and said at least one redundant word line, said redundancy decoder having memory elements and a deactivation unit connected to said memory elements, said deactivation unit deactivating, in the second mode of operation, redundancy programming that has been carried out for corresponding ones of said memory elements.

3. The dynamic memory according to claim 2, including jumper elements, each of said memory elements including a breakable connection for storing addresses for one of said word lines to be replaced by said at least one redundant word line, said connection broken as appropriate during redundancy programming, and said jumper elements bridging said connection in order to deactivate redundancy programming in the second mode of operation.

4. The dynamic memory according to claim 2, wherein said memory elements of said redundancy decoder have hold circuits for accepting information stored in said memory elements when a setting signal is activated, and said deactivation unit suppresses activation of said setting signal during the second mode of operation.

5. The dynamic memory according to claim 1, wherein said at least one redundant word line is assigned an address precoded before redundancy programming, and said at least one redundant word line is addressed using at least one of said address or a complement of said address in the second mode of operation.

6. The dynamic memory according to claim 1, including a test mode of operation for continuously testing said memory cells and switching the dynamic memory to the second mode of operation during the test mode.

7. The dynamic memory according to claim 1, wherein the second mode of operation is a refresh mode of operation, said memory cells have contents, and said contents of at least some of said memory cells are refreshed during said refresh mode.

* * * * *